United States Patent
Meguro et al.

(10) Patent No.: US 7,807,126 B2
(45) Date of Patent: *Oct. 5, 2010

(54) DIAMOND SINGLE CRYSTAL SUBSTRATE

(75) Inventors: Kiichi Meguro, Itami (JP); Yoshiyuki Yamamoto, Itami (JP); Takahiro Imai, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/364,609

(22) Filed: Feb. 3, 2009

(65) Prior Publication Data

US 2009/0142249 A1    Jun. 4, 2009

Related U.S. Application Data

(62) Division of application No. 11/388,970, filed on Mar. 27, 2006, now Pat. No. 7,524,372.

(30) Foreign Application Priority Data

| Mar. 28, 2005 | (JP) | ............... 2005-091061 |
| Jan. 19, 2006 | (JP) | ............... 2006-010596 |

(51) Int. Cl.
- C30B 23/00 (2006.01)
- C30B 25/00 (2006.01)
- C30B 28/12 (2006.01)
- C30B 28/14 (2006.01)
- B01J 3/06 (2006.01)
- B01J 3/08 (2006.01)
- C01B 31/06 (2006.01)

(52) U.S. Cl. .......................... 423/446; 117/89; 117/94; 117/95; 117/96; 117/105

(58) Field of Classification Search .................. None
See application file for complete search history.

(56) References Cited

U.S. PATENT DOCUMENTS 5,420,443 A    5/1995    Dreifus et al.

(Continued)

FOREIGN PATENT DOCUMENTS

EP    0 589 0464 A1    3/1994

(Continued)

OTHER PUBLICATIONS

Tsuno, T., et al. "Growth Rate and Surface Morphology of Diamond Homoepitaxial Films on Misoriented (001) Substrates" Jpn. J. Appl. Phys. 1996, vol. 35, pp. 4724-4727.

(Continued)

*Primary Examiner*—Melvin C Mayes
*Assistant Examiner*—Guinever S Gregorio
(74) *Attorney, Agent, or Firm*—McDermott Will & Emery LLP

(57) ABSTRACT

A method for manufacturing a diamond single crystal substrate, in which a single crystal is grown from a diamond single crystal serving as a seed substrate by vapor phase synthesis, said method comprising: preparing a diamond single crystal seed substrate which has a main surface whose planar orientation falls within an inclination range of not more than 8 degrees relative to a {100} plane or a {111} plane, as a seed substrate; forming a plurality of planes of different orientation which are inclined in the outer peripheral direction of the main surface relative to the main surface on one side of this seed substrate, by machining; and then growing a diamond single crystal by vapor phase synthesis.

2 Claims, 10 Drawing Sheets

U.S. PATENT DOCUMENTS

| | | |
|---|---|---|
| 5,474,021 A | 12/1995 | Tsuno et al. |
| 5,592,053 A | 1/1997 | Fox et al. |
| 2004/0144301 A1 * | 7/2004 | Neudeck et al. ............ 117/86 |
| 2004/0177803 A1 | 9/2004 | Searsbrook et al. |

FOREIGN PATENT DOCUMENTS

| | | |
|---|---|---|
| EP | 589464 A1 * | 3/1994 |
| EP | 0 879 904 A1 | 11/1998 |
| EP | 1 553 215 A2 | 11/2004 |
| JP | 3-75298 | 3/1991 |
| JP | 11-1392 | 1/1999 |

OTHER PUBLICATIONS

European Search Report issued in corresponding European Application No. 06 25 1555, dated Jul. 21, 2006.

Posthill et al., "Demonstration of a method to fabricate a large-area diamond single crystal," Thin Solid Films, Dec. 15, 1995, p. 39-49, vol. 271, No. 1, Elsevier Science S.A.

European Office Action issued in European Patent Application No. EP 06 251 555..6-1215 dated on Jun. 26, 2008.

* cited by examiner (a)

(b)

(a)

(b)

(c)

(a)

(b)

(c)

(d)

(a)

(b)

(a)

(b)

(a)

(b)

(c)

(a)

(b)

DIAMOND SINGLE CRYSTAL SUBSTRATE

RELATED APPLICATIONS

This application is a Divisional of U.S. application Ser. No. 11/388,970, now U.S. Pat. No. 7,524,372, filed on Mar. 27, 2006, claiming priority of Japanese Application Nos. JP 2005-091061, filed on Mar. 28, 2005 and JP 2006-010596, filed on Jan. 19, 2006. The entireties of each of the above applications are hereby incorporated by reference.

BACKGROUND OF THE INVENTION

1. Field of the Invention

The present invention relates to a method for manufacturing a diamond single crystal substrate, and more particularly relates to a method for manufacturing a large-surface area and high-quality diamond single crystal substrate, and to this diamond single crystal substrate, which can be used in semiconductor materials, electronic components, optical components, and so forth.

2. Description of Related Art

Diamond has many outstanding characteristics as a semiconductor material not found in other materials, such as its high thermal conductivity, high electron and hole mobility, high dielectric breakdown field, low dielectric loss, and wide bandgap. In recent years there has been particularly active development of field effect transistors having excellent high-frequency characteristics, and ultraviolet light emitting devices that take advantage of a wide bandgap.

Utilizing diamond as a semiconductor requires a high-quality single crystal substrate, just as with other semiconductor materials. At present, diamond single crystals are mainly obtained industrially by high-temperature, high-pressure synthesis methods, which result in better crystallinity than naturally occurring crystals, and these crystals have physical properties that allow them to be used as semiconductor substrates. However, the size of single crystals that can be obtained with today's high-temperature, high-pressure synthesis methods is limited to the order of one centimeter. The problem with such a small substrate is the semiconductor wafer process, which makes use of electron beam exposure, a stepper, or other such technology that is used in the micro fabrication of silicon and other ordinary semiconductors. A small substrate makes it difficult to use these processing apparatus that were designed with wafers a few inches in diameter in mind, and even if there were a processing apparatus specially intended for small substrates, this would not resolve the difficulties encountered in peripheral steps, such as the photoresist coating step.

One method that has been disclosed for obtaining a diamond single crystal substrate with a large surface area is to prepare a diamond single crystal consisting of low-index planes, and homoepitaxially grow diamond over this by vapor phase synthesis (Patent Document 1: Japanese Patent Publication 11-1392A).

Another method that has been disclosed involves forming a substrate that will serve as the nucleus of vapor phase growth by disposing a plurality of high-pressure phase substances having essentially mutually identical crystal orientations, and growing a single crystal over this by vapor phase synthesis, thereby obtaining an integrated, large single crystal (Patent Document 2: Japanese Patent Publication 3-75298A).

When diamond single crystals are grown by the method in Patent Document 1, the expansion growth rate in the lateral direction will never in principle exceed the growth rate in the upward direction. Obtaining a large-surface area substrate requires corresponding growth in the upward direction as well, which not only is inefficient, but when the crystal is grown rapidly in the upward direction, it is difficult to maintain the single crystal growth conditions in the lateral growth region.

When the method for obtaining a large single crystal described in Patent Document 2 is used, a single crystal seed substrate consisting of a plurality of plates usually does not have exactly the same orientation of the growth planes, and each plate has a slightly different planar orientation. When single crystal vapor phase synthesis is conducted using this substrate and the single crystals are integrated, the joined portions thereof have growth boundaries of different angles, called small angle boundaries, which are defects in the broad sense, and these basically do not disappear no matter how long the single crystal growth is continued. As a result, the semiconductor properties of the regions straddling the small angle boundaries are inferior to those of perfect single crystals, and when a device or the like is produced on the integrated single crystals, performance suffers at the portions that straddle the small angle boundaries.

SUMMARY OF THE INVENTION

The present invention was made in an effort to overcome the above problems, and it is an object thereof to provide a large-area, high-quality diamond single crystal substrate that is used in semiconductor materials, electronic components, optical components, and so forth, and a method for manufacturing this diamond single crystal substrate.

In order to solve the above-mentioned problems, the present invention has the following aspects 1 to 12.

(1) A method for manufacturing a diamond single crystal substrate, in which a single crystal is grown from a diamond single crystal serving as a seed substrate by vapor phase synthesis, said method comprising:

preparing a diamond single crystal seed substrate which has a main surface whose planar orientation falls within an inclination range of not more than 8 degrees relative to a {100} plane or a {111} plane, as a seed substrate;

forming a plurality of planes of different orientation which are inclined in the outer peripheral direction of the main surface relative to the main surface on one side of this seed substrate, by machining; and then growing a diamond single crystal by vapor phase synthesis.

(2) The method for manufacturing a diamond single crystal substrate according to (1) above, wherein a substrate which has a main surface whose planar orientation is within an inclination range of not more than 7 degrees relative to a {100} plane is prepared as the seed substrate, and the planar orientation of the plurality of planes formed inclined in the outer peripheral direction of the main surface is within an inclination range of at least 1 degree and not more than 8 degrees relative to the {100} plane.

(3) The method for manufacturing a diamond single crystal substrate according to (2) above, wherein the plurality of planes formed inclined in the outer peripheral direction of the main surface each consist of a plane inclined in the <100> direction or a <110> direction of the seed substrate outer periphery.

(4) The method for manufacturing a diamond single crystal substrate according to (1) above, wherein a substrate which has a main surface whose planar orientation is within an inclination range of not more than 7 degrees relative to a {111} plane is prepared as the seed substrate, and the planar orientation of the plurality of planes formed inclined in the outer peripheral direction of the main surface is within an inclination range of at least 1 degree and not more than 8 degrees relative to the {111} plane.

(5) The method for manufacturing a diamond single crystal substrate according to any one of (1) to (4) above, wherein side surfaces of the seed substrate are within an inclination range of at least 82 degrees and not more than 90 degrees relative to the main surface.

(6) The method for manufacturing a diamond single crystal substrate according to (5) above, wherein the side surface of the seed substrate is mechanically polished.

(7) The method for manufacturing a diamond single crystal substrate according to any one of (1) to (6) above, wherein the growth rate in the lateral direction from the seed substrate during the vapor phase synthesis of a diamond single crystal on the seed substrate is higher than the growth rate upward from the seed substrate.

(8) A method for manufacturing a diamond single crystal substrate which is constructed from a plurality of diamond single crystal seed substrates of uniform planar orientation lined up and integrated overall by growing diamond single crystals on the seed substrates by vapor phase synthesis, wherein the planar orientation of a main surface of all of the plurality of seed substrates but one has an inclination of less than 1 degree relative to a {100} plane, the planar orientation of a main surface of the remaining one seed substrate has an inclination of not more than 8 degrees relative to a {100} plane, the method comprising:

forming a plurality of planes of different orientation which are inclined in an outer peripheral direction of the main surface relative to the main surface on one side of this one seed substrate, by machining;

lining up the plurality of seed substrates so as to surround this one seed substrate by the remaining plurality of seed substrates; and then growing diamond single crystals by vapor phase synthesis, whereby the diamond single crystal grown from this one seed substrate is made to cover the diamond single crystals grown on the other seed substrates and cause integrating.

(9) The method for manufacturing a diamond single crystal substrate according to (8) above, wherein the planar orientation of the main surface of the one seed substrate has an inclination of not more than 7 degrees relative to the {100} plane, and the planar orientation of the plurality of planes formed inclined in the outer peripheral direction of the main surface is within an inclination range of at least 1 degree and not more than 8 degrees relative to the {100} plane.

(10) The method for manufacturing a diamond single crystal substrate according to (9) above, wherein the plurality of planes formed inclined in the outer peripheral direction of the main surface of the one seed substrate each consist of a plane inclined in a <100> direction or a <110> direction of the seed substrate outer periphery.

(11) A diamond single crystal substrate, in which a diamond single crystal is grown on a diamond single crystal seed substrate by vapor phase synthesis and the growth width in the lateral direction from the seed substrate in a single crystal layer obtained by vapor phase synthesis is greater than the growth width upward from the seed substrate.

(12) A diamond single crystal substrate which is constructed from a plurality of diamond single crystal seed substrates of uniform planar orientation lined up and integrated overall by growing diamond single crystals on the seed substrates by vapor phase synthesis, wherein the planar orientation of a main surface of all of the plurality of seed substrates but one has an inclination of less than 1 degree relative to a {100} plane, the planar orientation of a main surface of the remaining one seed substrate has an inclination of not more than 8 degrees relative to the {100} plane, the diamond single crystal substrate having been manufactured by a method comprising forming a plurality of planes of different orientation which are inclined in an outer peripheral direction of the main surface relative to the main surface on one side of this one seed substrate, by machining; lining up the plurality of seed substrates so as to surround this one seed substrate by the remaining plurality of seed substrates; and then growing diamond single crystals by vapor phase synthesis, whereby the diamond single crystal grown from this one seed substrate is made to cover the diamond single crystals grown on the other seed substrates and cause integrating.

DETAILED DESCRIPTION OF THE PREFERRED EMBODIMENTS

The present invention as given above will now be described.

In single crystal growth from diamond single crystal seed substrates by vapor phase synthesis, it is known that a difference in growth rate occurs between the substrate planar orientation of a certain single crystal substrate that serves as a reference and a planar orientation that is slightly deviated from this first planar orientation (the angle of deviation from the reference planar orientation will be referred to as the "off-angle," and this plane will be referred to as the "off-plane") (see Patent Document 1, for example). The absolute value of the off-angle and the growth rate upward from the seed substrate are the only things mentioned in Non-Patent Document 1 (Jpn. J. Appl. Phys., Vol. 35 (1996), pp. 4724-4727), but the inventors of the present invention closely scrutinized the growth rate in the lateral direction, as well as the direction and size of the off-angle, in an attempt to make lateral growth more efficient. As a result, as shown schematically in FIG. 1(a), when a diamond single crystal 2 was grown from a seed substrate 1 having an off-angle 4, not only was the upward growth rate faster than when a diamond single crystal 2' was grown from a seed substrate 1' having no off-angle 3' (FIG. 1(b)), but it was found that there are times when the lateral growth rate, which is in the opposite direction from the reference direction 3 of the off-plane, is faster than in the upward direction. The present inventors thought that it might be possible to raise the lateral growth rate if this phenomenon were utilized to reshape the surface of the seed substrate. Furthermore, they thought that it might be possible to obtain a substantially large single crystal substrate with no small angle boundaries if this phenomenon were also utilized in a method for manufacturing a diamond single crystal substrate in which a single crystal substrate is integrally grown by vapor phase synthesis from a plurality of single seed substrates. It was in this way that the inventors arrived at the present invention.

Figure 2:
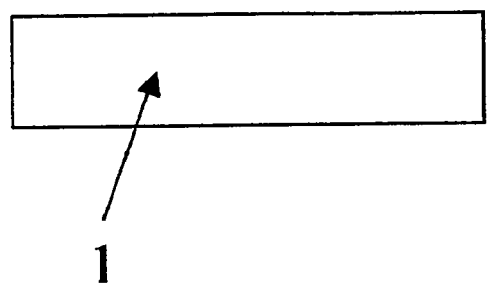
FIG. 2 is an example of the steps involved in obtaining a diamond single crystal substrate with the present invention, with FIG. 2(a) being a side view of a pre-machining seed substrate, FIG. 2(b) a side view of after an off-angle has been formed on the pre-machining seed substrate, and FIG. 2(c) a side view of after a diamond single crystal has been formed following off-angle formation.
Figure 2:
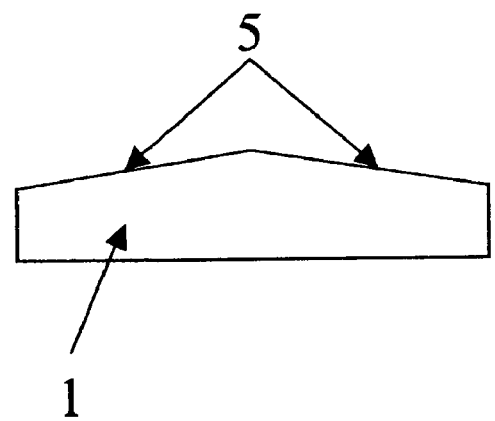
Figure 2:
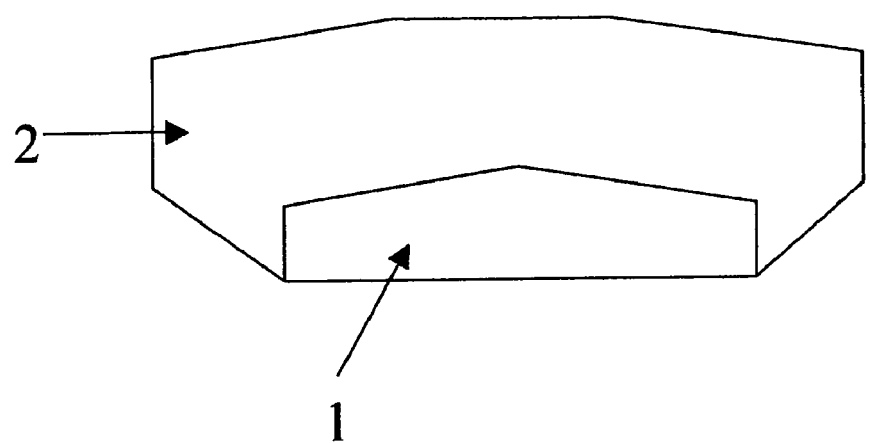

Specifically, a diamond single crystal seed substrate 1, in which the off-angle of a main surface falls within a range of not more than 8 degrees relative to the {100} plane or the {111} plane, is prepared as a seed substrate, and a plurality of off-planes 5 of different orientation, which are inclined in the outer peripheral direction of the main surface relative to the main surface on one side of this seed substrate 1, are formed by machining. When a diamond single crystal 2 is grown by vapor phase synthesis in this state, the growth is faster in the lateral direction than growth from the reference crystal with no off-angle, making this is an efficient way to increase the size of the single crystal. This step is schematically illustrated in FIG. 2.

The goal of increasing the rate of lateral growth will be achieved as long as a main surface of the seed substrate prepared with the present invention has an off-angle that falls within the range of no more than 8 degrees from the {100} or {111} plane, but a preferable range is no more than 7 degrees from each of these planes, and it is preferable that the off-angle of the machined planes formed inclined in the outer peripheral direction is at least 1 degree and no more than 8 degrees. It is even more preferable if the off-angle of the prepared seed substrate is no more than 3 degrees from each of the {100} and {111} planes, and the off-angle of the machined planes is at least 1.5 degrees and no more than 6.5 degrees, and it is particularly favorable for these ranges to be no more than 1 degree, and at least 2 degrees and no more than 5 degrees, respectively. Keeping the planar orientation of the seed substrate within the above range increases the lateral growth rate and allows a large single crystal substrate to be obtained with ease. It is preferable if a main surface of the seed substrate prior to single crystal growth is machined over the entire original seed substrate surface, and consists only of a plurality of planes (off-planes) that have been machined to within the above-mentioned off-angle range, but it is permissible for portions of the pre-machining seed substrate surface to remain. Again in this case, it is preferable that the machined off-planes account for at least 70%, and even more preferably, at least 90%, of the total surface.

Figure 3:
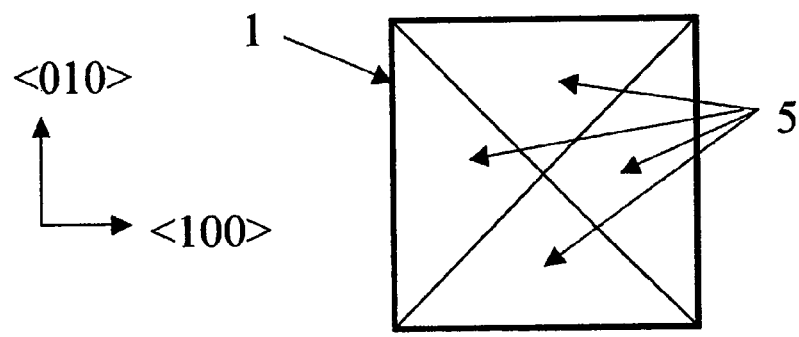
FIG. 3 consists of examples of the off-plane formed on a seed substrate, with FIG. 3(a) being a top view of an off-plane formed in the outer peripheral <100> direction, FIG. 3(b) a side view of an off-plane formed in the outer peripheral <100> direction, FIG. 3(c) a top view of an off-plane formed in the outer peripheral <110> direction, and FIG. 3(d) a top view of an off-plane formed in the outer peripheral <100> and <110> directions.
Figure 3:
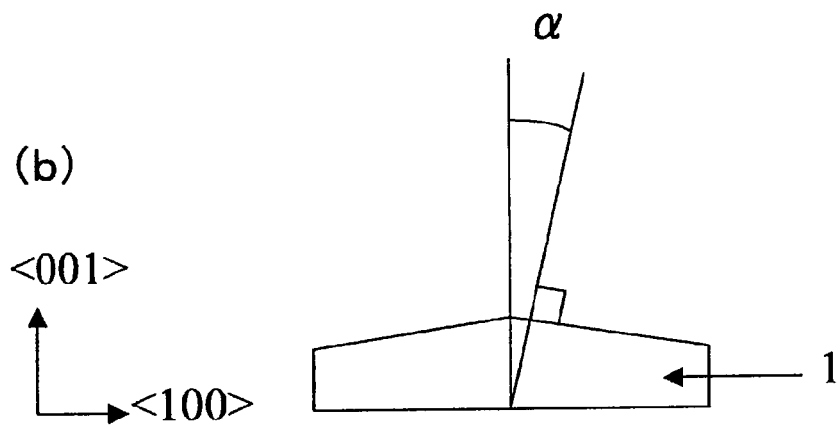
Figure 3:
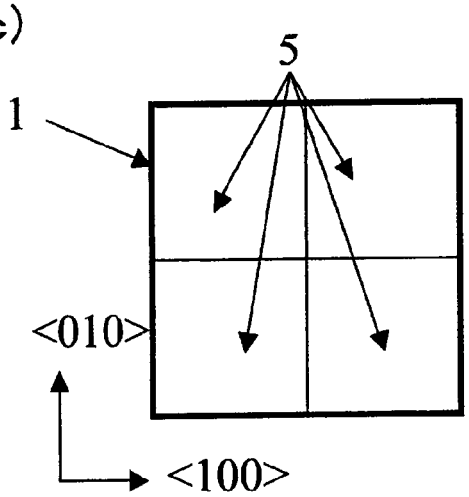
Figure 3:
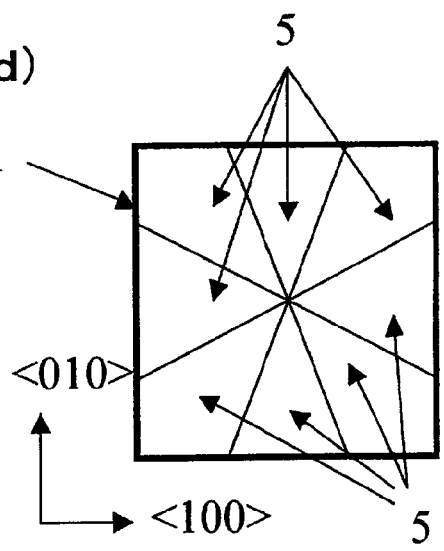

It is better for the pre-machining main surface of the prepared seed substrate to be closer to the {100} plane because this will facilitate subsequent off-plane formation by machining and single crystal growth. If the lateral growth rate is to be increased in the side surface <100> direction, the planar orientations of the off-planes formed by machining this substrate preferably consist of four different planes 5 (FIGS. 3(a) and 3(b)) whose planar orientation faces in the <100> direction of the seed substrate outer periphery. Similarly, if the lateral growth rate is to be increased in the <110> direction, four different planes 5 facing in the <110> direction may be formed (FIG. 3(c)). If the growth rate is to be increased in both the <100> direction and the <110> direction, then eight different planes 5 facing in the <100> direction and the <110> direction may be formed (FIG. 3(d)). The shape of the prepared seed substrate 1 is preferably a hexahedron, in which the side surfaces consist of {100} planes shown in FIG. 3, or planes whose inclination relative to the {100} plane falls within a range of 5 degrees or less. Preparing a substrate such as this and machining it to the above shape allow a single crystal to be grown in a state of the fastest lateral growth. The above-mentioned outer peripheral direction (<100> or <110>) is defined not only strictly to include the outer peripheral <100> direction or <110> direction, but also to include planes deviating by no more than 5 degrees from the rotational direction parallel to the substrate plane in each of these directions.

Side surfaces of the seed substrate preferably have an inclination that falls within a range of at least 82 degrees and no more than 90 degrees relative to the main surface, and a range of at least 85 degrees and no more than 88 degrees is even more favorable. Off-planes can also be formed on side surfaces by tilting the seed substrate side surfaces slightly from the vertical, and growth in the lateral direction can be further increased. These tilted side surfaces can be formed by laser cutting, but they are preferably planes that have been mechanically polished. This allows lateral growth to be controlled with better reproducibility.

With the diamond single crystal growth in the present invention, it is preferable that growth in the lateral direction from the seed substrate be faster than upward growth from the seed substrate. The growth rate in the lateral direction referred to here is defined as the quotient of dividing the width of the portion with the most lateral growth from a seed substrate side surface by the growth time. The growth rate in the upward direction is defined as the quotient of dividing the width of the most upward growth from a seed substrate side surface by the growth time. If the above condition is met, the substrate can be grown larger while still maintaining the single crystal growth conditions. With a single crystal substrate obtained in this manner, the crystallinity in the growth region on the seed substrate will be close to that in the region of expansion growth in the lateral direction, and this single crystal substrate can be used in applications to semiconductors and the like.

Figure 4:
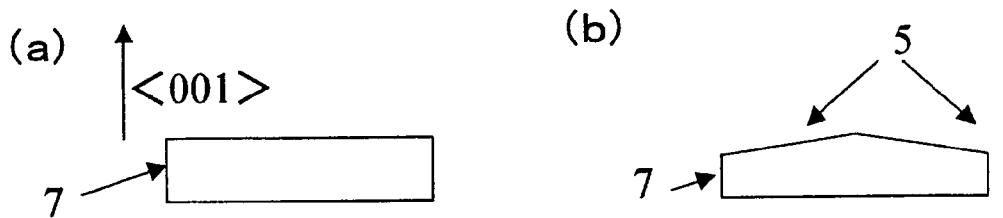
FIG. 4 is an example of the steps involved in obtaining an integrated diamond single crystal substrate from a plurality of diamond single crystal seed substrates by the present invention, with FIG. 4(a) being a side view of a pre-machining off-substrate, FIG. 4(b) a side view of the off-substrate after the formation of an off-plane, FIG. 4(c) a side view of the main substrates arranged around the outer periphery of the off-substrate, FIG. 4(d) a top view of the main substrates arranged around the outer periphery of the off-substrate, and FIG. 4(e) a progression diagram of when a diamond single crystal has been grown on the off-substrate/main substrates.
Figure 4:
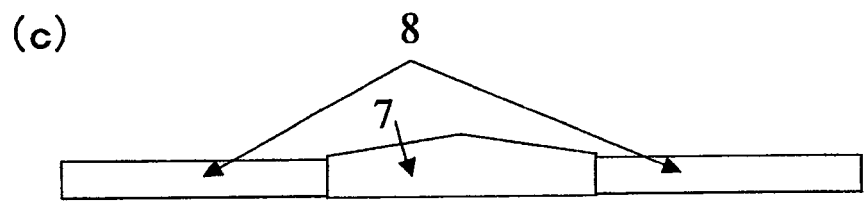
Figure 4:
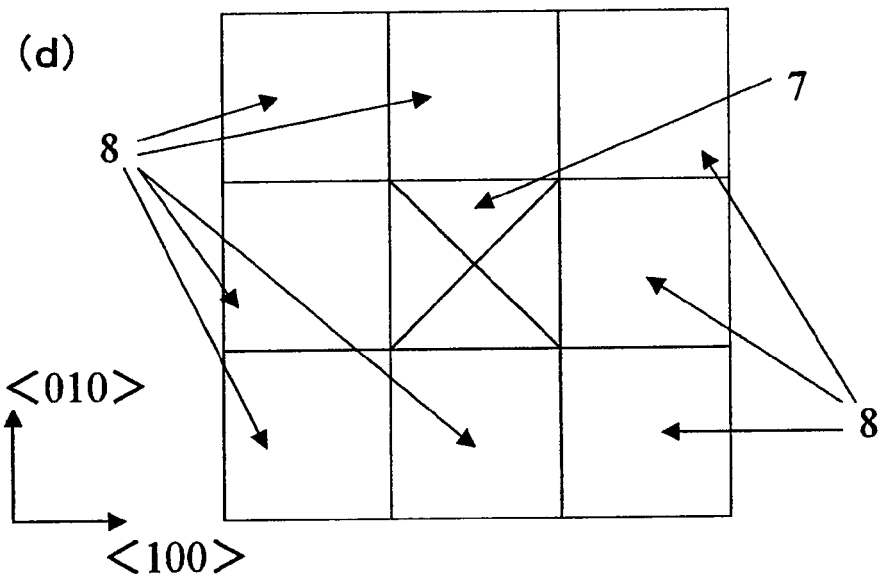
Figure 4:
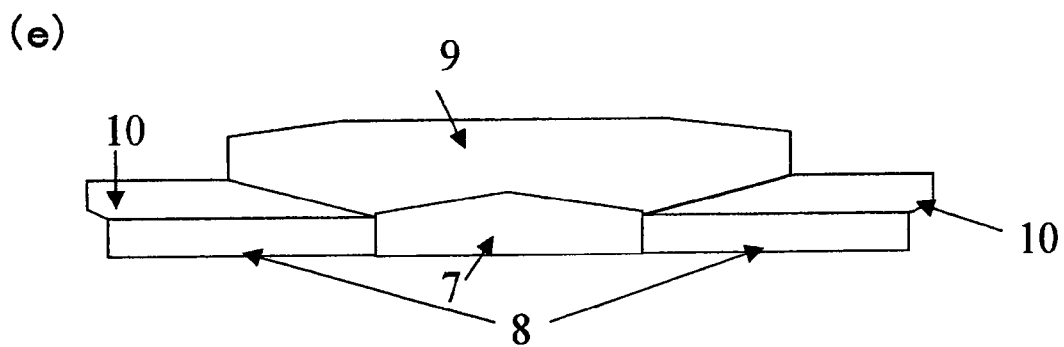

With the method of the present invention, in which a plurality of diamond single crystal seed substrates are lined up, and integrated by growing a diamond single crystal on the seed substrates by vapor phase synthesis, the planar orientation of a main surface of all of the plurality of seed substrates but one (hereinafter referred to as the "main substrates") has an inclination of less than 1 degree relative to the {100} plane, and the planar orientation of a main surface of the one remaining seed substrate (hereinafter referred to as the "off-substrate") has an inclination of not more than 8 degrees relative to the {100} plane. Next, a plurality of planes of different orientation, which are inclined in the outer peripheral direction of the main surface relative to the main surface on one side of this off-substrate, are formed by machining. In the lining up of the plurality of seed substrates, this off-substrate 7 is disposed so as to be surrounded by the remaining plurality of main substrates 8, and a diamond single crystal is grown by a vapor phase synthesis over this, thereby integrating. FIG. 4 is a schematic diagram of this step. The effect of employing this method of the present invention is that the diamond single crystal 9 grown from the off-substrate 7 covers the top of the diamond single crystals 10 grown from the main substrates 8, yielding a diamond single crystal with a large surface area, that is substantially integrated, and that has no small angle boundaries. Also, with this method, since the main substrates 8 are disposed around the off-substrate 7, the growth conditions of the region of lateral growth from the off-substrate 7 will tend to be maintained as single crystal growth conditions, which is more suitable for large-area growth over an extended period than when an off-substrate is used by itself as the seed substrate.

It is sufficient if the off-angle of the main substrates 8 is less than 1 degree from the {100} plane, but it is preferably no more than 0.5 degree, and ideally, the closer this off-angle is to zero, the better.

The off-angle of the prepared off-substrate is preferably in the range of no more than 7 degrees from the {100} plane, and the off-angle of the machined planes formed inclined in the outer peripheral direction is preferably at least 1 degree and no more than 8 degrees from the {100} plane. More preferably, the off-angle of the prepared off-substrate is no more than 3 degrees from the {100} plane, and the off-angle of the machined planes is at least 1.5 degrees and no more than 6.5 degrees, with ranges of no more than 1 degree, and at least 2 degrees and no more than 5 degrees being particularly favorable. The off-planes formed by machining preferably each consist of a plane oriented in the <100> direction or the <110> direction of the outer periphery of the seed substrate.

As to the shape of the main substrates and off-substrate, single crystal substrates with a cubic or rectangular parallelepiped shape are preferable, the planar orientation of the side surfaces is preferably {100}. When substrates of such shape are used, it is preferable that the main substrates and the off-substrate be disposed in a square or rectangular configuration, that is, so that the interfaces between the substrates have a cruciform shape. It is also preferable for the pre-machining off-substrate to be thicker than the main substrates, and for the outer peripheral part of the post-machining off-substrate to be thicker than the main substrates.

The diamond single crystal substrate pertaining to the present invention is an integrated single crystal in which no small angle boundaries are present in the region of growth from the off-substrate. In addition, although this substrate can also be used as a semiconductor substrate by producing a device or the like, it can be utilized as a diamond single crystal substrate having a large surface area and the intrinsic semiconductor characteristics of diamond by cutting out only the integrated layer of the outermost surface.

As described above, the diamond single crystal substrate and the method for manufacturing a diamond single crystal substrate pertaining to the present invention allow a large-surface area and high-quality diamond single crystal substrate to be used in semiconductor materials, electronic components, optical components, and so forth.

The present invention will now be described in detail through examples.

Example 1

In this example we will discuss a case in which a single crystal was grown by vapor phase synthesis from one diamond single crystal seed substrate obtained by high-temperature, high-pressure synthesis. The seed substrate was a rectangular parallelepiped measuring 4 mm (longitudinal and lateral) by 1 mm (thickness), and the main and side surfaces had been perpendicularly polished, respectively. The planar orientation serving as a reference for the main and side surfaces was {100}, and the off-angle from the {100} plane of the main surface was 0.0 degrees.

Four off-planes 5, which were inclined toward the outer periphery {100} plane relative to the main surface on one side of this substrate 1, were formed by polishing (FIGS. 3a and 3b). The off-angles ($\alpha$ in FIG. 3b) of the four off-planes 5 from the main surface <100> direction were all 3.0 degrees.

A diamond single crystal was grown by an ordinary microwave plasma CVD process on this seed substrate 1. The growth conditions were as follows.

Microwave frequency: 2.45 GHz

Microwave power: 10 kW

Chamber internal pressure: $1.33 \times 10^4$ Pa $H_2$ gas flow: 100 sccm $CH_4$ gas flow: 10 sccm Substrate temperature: 950° C.

Growth time: 100 hours

Figure 5:
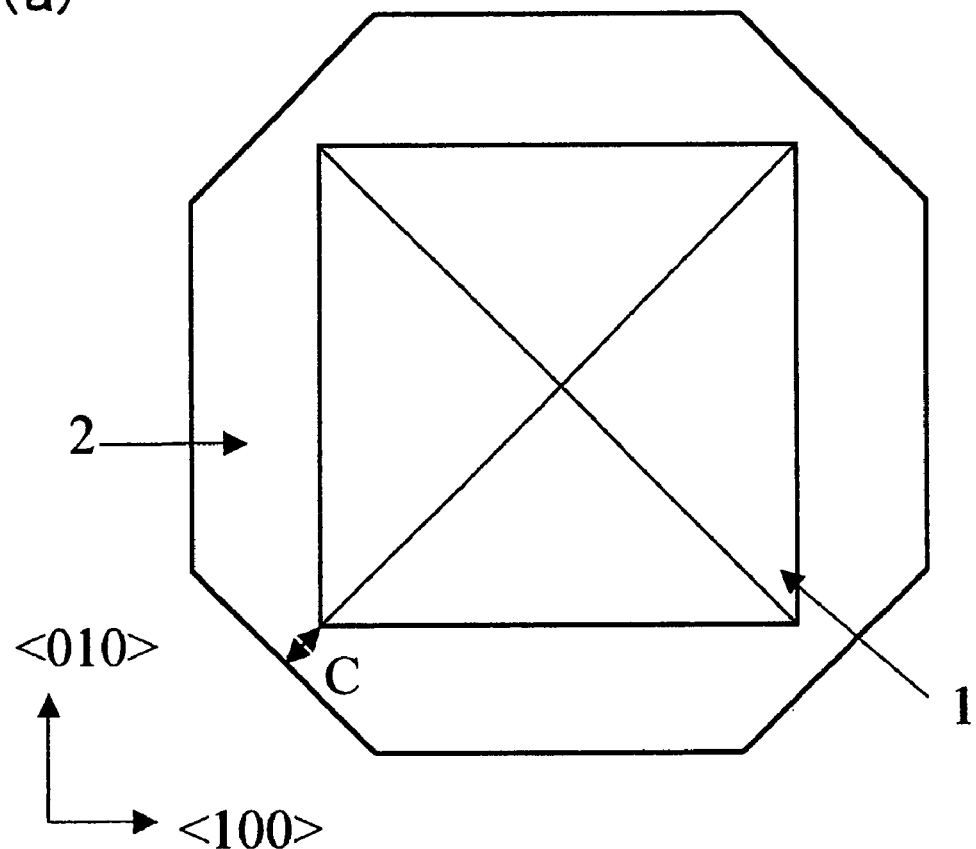
FIG. 5 is a schematic diagram of after the growth of the diamond single crystal in Example 1, with FIG. 5(a) being a top view and FIG. 5(b) a side view.
Figure 5:
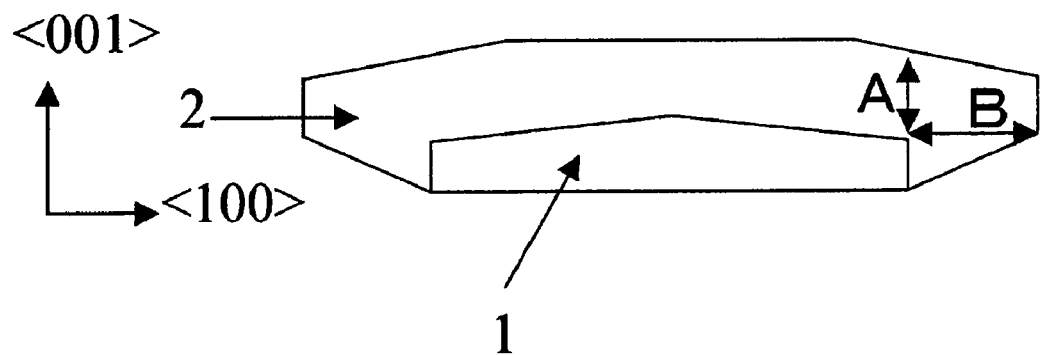

As shown in FIG. 5, the result of the growth was that a diamond single crystal substrate 2 was obtained in which the thickness A of the vapor phase synthesized single crystal layer in the upward direction was 1.5 mm, the thickness B in the lateral <100> direction was 3 mm, and the thickness C in the lateral <110> direction was 1 mm.

This vapor phase synthesized single crystal layer was cut out with a laser, and the hole mobility of a hydrogenated surface conduction layer at normal temperature was evaluated by Hall measurement, the result of which was that a value of 1000 $cm^2$/V·sec was obtained, which is a high enough rate for a semiconductor substrate. The surface was further smoothed by polishing, and the transmission light spectrum in the ultraviolet-visible region was measured. As a result, the transmittance was over 70%, which is close to the theoretical limit, in the region of from an absorption edge of 225 nm up to a long-wavelength region beyond 800 nm, and good crystallinity was indicated.

Example 2

In this example, the same seed substrate as in Example 1 was prepared, and single crystals were grown at different inclinations of the side surfaces relative to the main surfaces. The inclination of the side surfaces was formed by slantingly polishing the substrate, using a polisher capable of slanted polishing. The diamond single crystal substrate growth conditions were the same as in Example 1. Table 1 shows the relationship between the lateral growth rate and the inclination of the side surfaces relative to the main surfaces.

TABLE 1

| Sample No. | Inclination angle of side surfaces relative to main surface (degrees) | Lateral growth rate B (μm/hr) |
| --- | --- | --- |
| 1 | 90.0 | 30.0 |
| 2 | 88.5 | 32.1 |
| 3 | 87.5 | 38.9 |
| 4 | 85.5 | 37.5 |
| 5 | 86.5 | 33.0 |
| 6 | 82.5 | 30.5 |
| 7 | 81.5 | partial polycrystallization |

Sample No. 1 in Table 1 is the result of Example 1, which is given for the sake of comparison. Sample Nos. 2 to 7 are examples for different inclinations of the side surfaces relative to the main surfaces. It can be seen from these results that if the inclination of the side surfaces is within a specific range, the lateral growth rate will be higher than when the side surfaces are perpendicular.

Comparative Example 1

Figure 1:
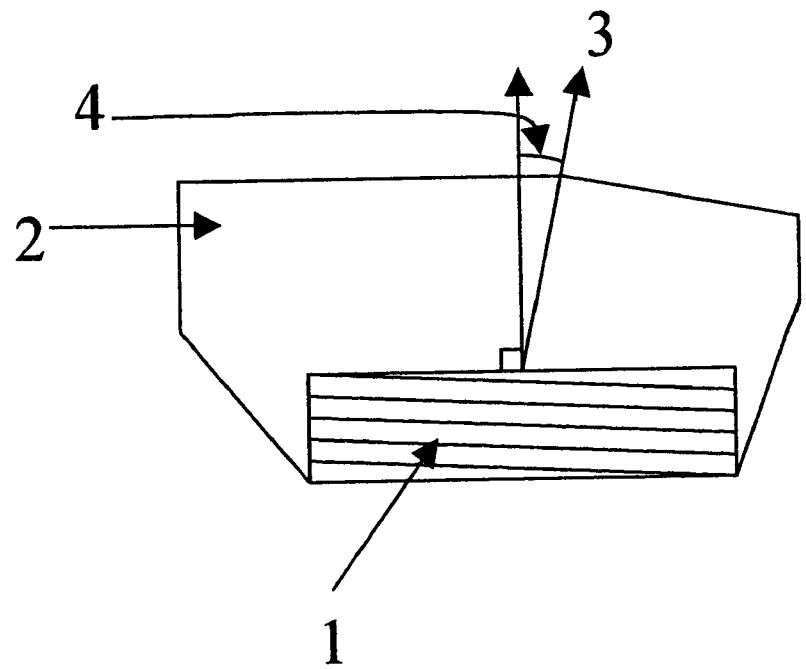
FIG. 1 is a schematic diagram comparing the difference in diamond single crystal growth state depending on whether or not the seed substrate has an off-angle, with FIG. 1(a) being a side view of when a single crystal is grown from a seed substrate with an off-angle, and FIG. 1(b) a side view of when a single crystal is grown from a seed substrate without an off-angle.
Figure 1:
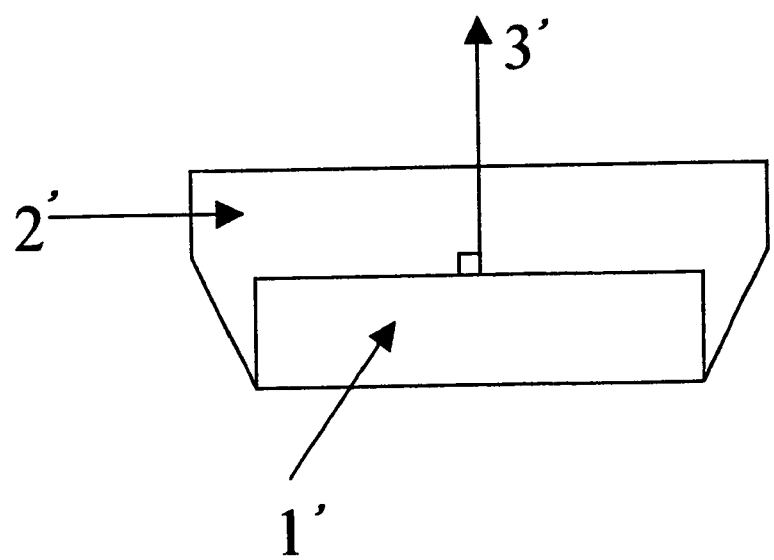

Here, as Comparative Example 1, a seed substrate of the same size and planar orientation as that used in Example 1 was prepared, and a diamond single crystal was grown without forming four off-planes (FIG. 1(b)). The growth conditions and time were the same as in Example 1 above. As a result, the thickness in the upward direction was 1 mm, the thickness in the lateral <100> direction was 0.5 mm, and the thickness in the lateral <110> direction was 0.2 mm, all of which indicated growth rates under those in the examples of this invention. The proportional decrease in the lateral growth rate compared to that in the upward direction was particularly great, and the effect of using the present invention in terms of raising the lateral growth rate was confirmed by Example 1 and Comparative Example 1.

Example 3

Figure 6:
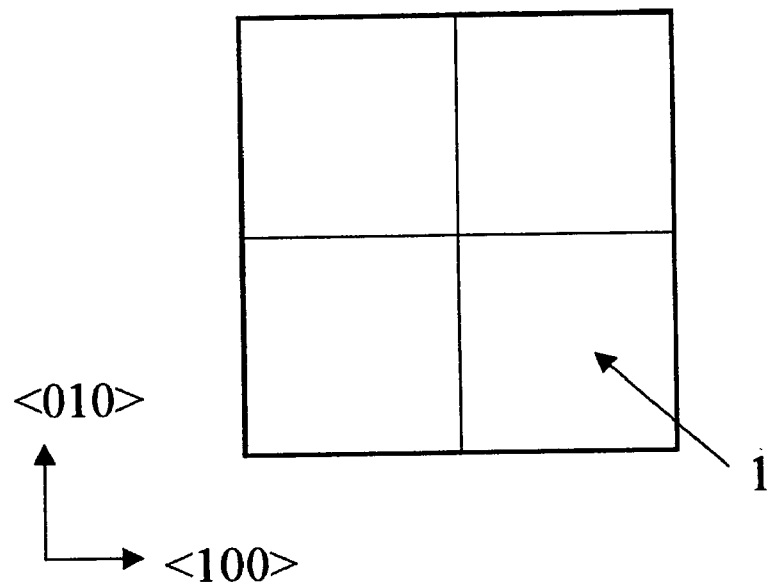
FIG. 6 is a schematic diagram of after the growth of the diamond single crystal in Example 3, with FIG. 6(a) being a top view and FIG. 6(b) a side view.
Figure 6:
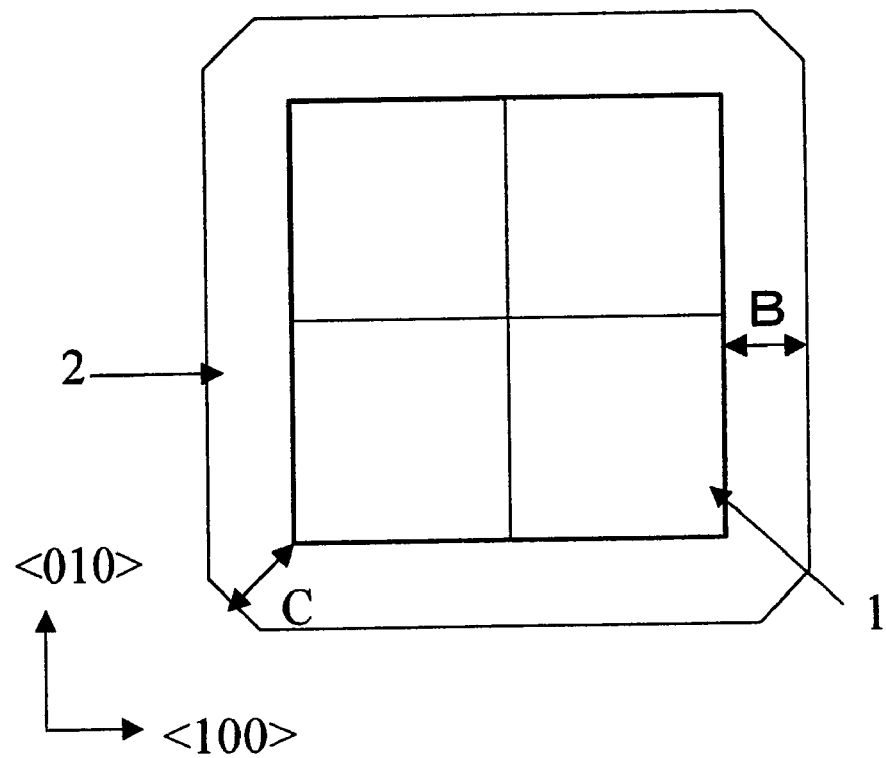

In this example, the same seed substrate 1 as in Example 1 was prepared, and four off-planes which were inclined toward the outer periphery <110> were formed by polishing (FIG. 6(a)). The off-angles of the four off-planes from the main surface <100> direction were all 3.0 degrees. After this, a diamond single crystal substrate was grown under the same conditions as in Example 1.

As shown in FIG. 6(b), the result of the growth was that a diamond single crystal substrate 2 was obtained in which the thickness A of the vapor phase synthesized single crystal layer in the upward direction was 1.5 mm, the thickness B in the lateral <100> direction was 1.8 mm, and the thickness C in the lateral <110> direction was 2 mm.

This vapor phase synthesized single crystal layer was cut out with a laser, and the hole mobility of a hydrogenated surface conduction layer at normal temperature was evaluated by Hall measurement, the result of which was that a value of 1000 cm$^2$/V·sec was obtained, which is a high enough rate for a semiconductor substrate. The surface was further smoothed by polishing, and the light transmission spectrum in the ultraviolet-visible region was measured. As a result, the transmittance was over 70%, which is close to the theoretical limit, in the range of from an absorption edge of 225 nm up to a long-wavelength region beyond 800 nm, and good crystallinity was indicated.

Example 4

In this example we will discuss a case in which a single crystal was grown by vapor phase synthesis from a {111} single crystal seed substrate obtained by high-temperature, high-pressure synthesis. The seed substrate was a rectangular parallelepiped measuring 3 mm (longitudinal and lateral) by 0.8 mm (thickness), and the main and side surfaces had been perpendicularly polished, respectively. The planar orientation serving as a reference for the main surface was {111}, and the off-angle from the <111> direction of the main surface was 0.8 degree. The planar orientation serving as reference of the side surfaces was {211} and {110} planes, and the off-angle from the planes serving as reference of each was 0.4 degree.

Four off-planes, which were inclined toward the outer peripheral plane relative to the main surface on one side of this substrate, were formed by polishing. The off-angles of the four off-planes from the main surface <111> direction were all 3.2 degrees.

A diamond single crystal substrate was grown on this seed substrate by microwave plasma CVD in the same manner as in Example 1. The growth conditions were as follows.

Microwave frequency: 2.45 GHz
Microwave power: 10 kW
Chamber internal pressure: 1.33×10$^4$ Pa
H$_2$ gas flow: 100 sccm
CH$_4$ gas flow: 1 sccm
Substrate temperature: 1050° C.
Growth time: 100 hours The result of the growth was that a diamond single crystal substrate was obtained in which the thickness of the vapor phase synthesized single crystal layer in the upward direction was 0.2 mm, and the thickness in the lateral direction was 0.3 mm.

This vapor phase synthesized single crystal layer was cut out with a laser, and the hole mobility of a hydrogenated surface conduction layer at normal temperature was evaluated by Hall measurement, the result of which was that a value of 900 cm$^2$/V·sec was obtained, which is a high enough rate for a semiconductor substrate. The surface was further smoothed by polishing, and the light transmission spectrum in the ultraviolet-visible region was measured. As a result, the transmittance was over 70%, which is close to the theoretical limit, in the range of from an absorption edge of 225 nm up to a long-wavelength region beyond 800 nm, and good crystallinity was indicated.

Comparative Example 2

Here, as Comparative Example 2, a seed substrate of the same size and planar orientation as that used in Example 4 was prepared, and a diamond single crystal substrate was grown without forming four off-planes. The growth conditions and time were the same as in Example 4. As a result, the thickness in the upward direction was 0.1 mm and the thickness in the lateral direction was 0.05 mm, both of which indicated growth rates under those in the Example 4.

The proportional decrease in the lateral growth rate compared to that in the upward direction was particularly great, and the effect of using the present invention in terms of raising the lateral growth rate was confirmed by Example 4 and Comparative Example 2.

Example 5

In this Example 5 we will discuss a case in which a single crystal was grown by vapor phase synthesis from single crystal seed substrates of different off-angles. The seed substrates were each a rectangular parallelepiped measuring 4 mm (longitudinal and lateral) by 1 mm (thickness), and the main and side surfaces had been perpendicularly polished, respectively. The planar orientation serving as a reference for the main and side surfaces was {100}. The off-angle from the {100} plane in the pre-machining seed substrate main surface was termed the pre-machining off-angle, the off-angle from the {100} plane in planes formed by machining at an inclined angle in the outer peripheral direction was termed the post-machining off-angle, and the growth states (single crystal growth rates) were compared when these off-angles were varied. The growth conditions were the same as in Example 1. Table 2 shows the relationship between the growth rate in the lateral <100> direction and the upward direction after growth, and the off-angles.

TABLE 2

| Sample No. | Pre-machining off-angle (degrees) | Post-machining off-angle (degrees) | Upward growth rate A (µm/hr) | Lateral growth rate B (µm/hr) | Growth rate ratio (B/A) |
|---|---|---|---|---|---|
| 8 | 0.0 | 3.0 | 15.0 | 30.0 | 2.0 |
| 9 | 0.0 | (no machining) | 10.0 | 5.0 | 0.5 |
| 10 | 0.9 | 2.1 | 13.1 | 21.3 | 1.6 |
| 11 | 2.9 | 6.4 | 12.5 | 15.6 | 1.2 |
| 12 | 6.9 | 7.9 | 11.8 | 12.9 | 1.1 |
| 13 | 0.0 | 0.9 | 11.0 | 11.5 | 1.0 |
| 14 | 7.9 | 8.1 | 9.1 | 8.9 | 1.0 |
| 15 | 8.1 | 9.0 | polycrystallization | polycrystallization | — |
| 16 | 7.9 | 1.0 | polycrystallization | polycrystallization | — |

Figure 7:
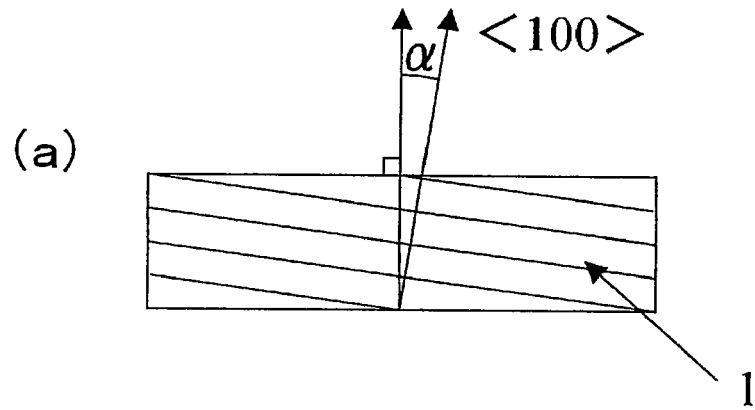
FIG. 7 is a schematic diagram of a comparative example in which the pre-machining off-angle is large, with FIG. 7(a) being a side view of the pre-machining seed substrate, FIG. 7(b) a side view of the seed substrate after machining of the off-plane, and FIG. 7(c) a side view after diamond growth.
Figure 7:
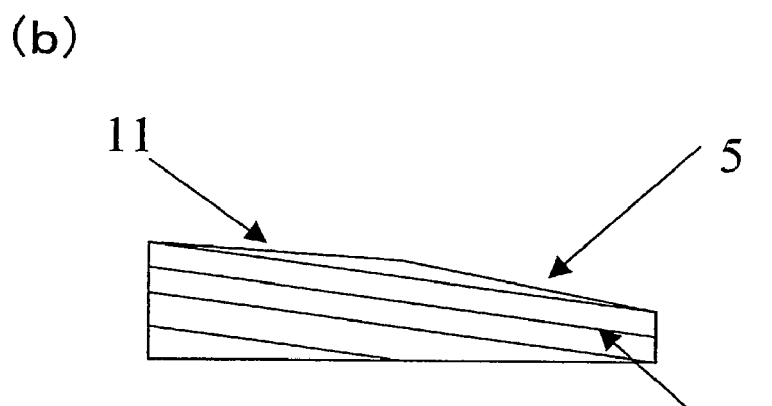
Figure 7:
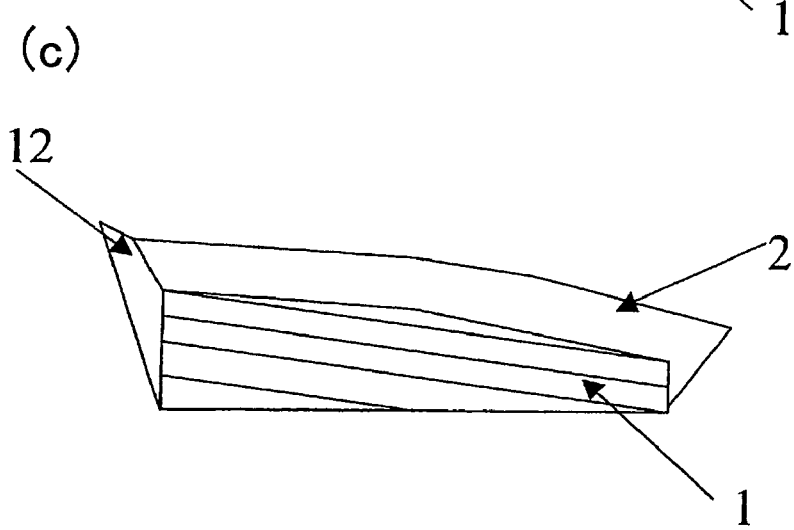

For the sake of comparison, Sample Nos. 8 and 9 in Table 2 are the results of Example 1 and Comparative Example 1. Sample No. 10 to 14 are examples in which the pre- and post-machining off-angles are different from each other. With all of these the lateral growth was faster than with Sample No. 9 of Comparative Example 1, and it can be seen that the method of the present invention is effective at increasing growth. Sample No. 15 is a comparative example in which the pre-machining off-angle exceeded the range of the present invention. This larger off-angle resulted in polycrystallization, as the single crystal growth conditions could not be maintained. Sample No. 16 in a comparative example in which the pre-machining off-angle was within the range of the present invention, but the post-machining off-angle was small, and the off-plane 11 was inclined in the direction which is opposite from the outer peripheral direction within the range of the present invention (FIG. 7). In growth using this substrate, the outer peripheral part ended up being higher than the center part of the substrate, polycrystalline growth 12 proceeded around the outer periphery, and single crystal lateral growth could not be achieved.

Example 6

In this example we will discuss a case in which single crystals were grown by vapor phase synthesis from a plurality of diamond single crystal seed substrates obtained by high-temperature, high-pressure synthesis, and then integrated. Of the nine seed substrates prepared, eight main substrates were rectangular parallelepipeds measuring 4 mm (longitudinal and lateral) by 0.8 mm (thickness), and the off-substrate was a rectangular parallelepiped measuring 4 mm (longitudinal and lateral) by 1 mm (thickness). The main and side surfaces had been respectively polished perpendicularly, and the planar orientation serving as a reference thereof was {100}. The main surface off-angles of the eight main substrates were respectively different in the range of from 0.1 to 0.9, while the main surface off-angle of the one off-substrate was 0.0 degrees. Four off-planes, which were inclined toward the outer peripheral {100} plane relative to the main surface on one side of this substrate, were formed by polishing. The off-angles of the four off-planes from the main surface <100> direction were all 3.0 degrees. After this, the substrates were lined up so that the off-substrate 7 was surrounded by the main substrates 8 as shown in FIG. 4(d), and then placed in a synthesis apparatus. A diamond single crystal was grown by microwave plasma CVD on these seed substrates. The growth conditions were as follows.

Figure 8:
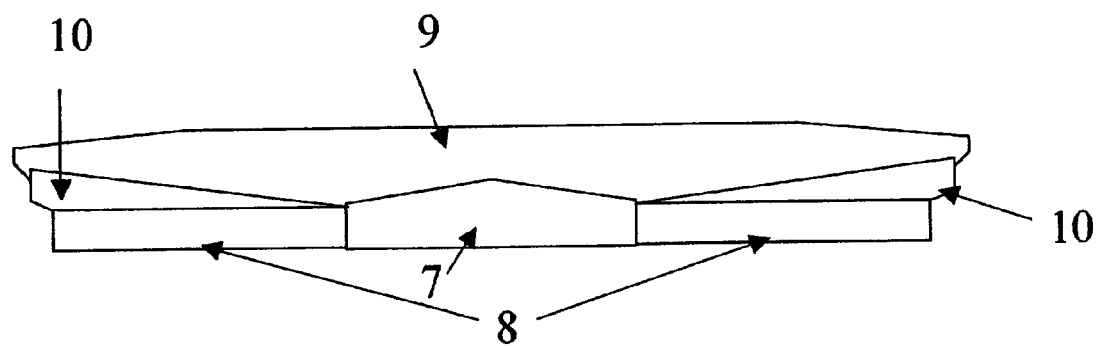
FIG. 8 is a schematic diagram of after the growth of the diamond single crystal in Example 6.

Microwave frequency: 2.45 GHz
Microwave power: 10 kW
Chamber internal pressure: $1.33 \times 10^4$ Pa
$H_2$ gas flow: 100 sccm
$CH_4$ gas flow: 10 sccm
Substrate temperature: 950° C.
Growth time: 150 hours As shown in FIG. 8, the result of the growth was that a single crystal 9, grown from the off-substrate such that the thickness was 2.2 mm in the upward direction of the vapor phase synthesized single crystal layer, covered the entire surface, yielding an integrally connected diamond single crystal substrate. There were no small angle boundaries in the outermost surface layer thereof. The integrated single crystal layer of this single crystal substrate was cut out with a laser, and the hole mobility of a hydrogenated surface conduction layer at normal temperature was evaluated by Hall measurement, the result of which was that a value of 1000 cm$^2$/V·sec was obtained, which is a high enough rate for a semiconductor substrate.

Next, for the sake of comparison, we will discuss the results of growing single crystals under the growth conditions of Example 6 for when the off-angle of the main substrates was changed, when the off-angle of the pre-machining off-substrate was changed, when the off-angle of the off-plane formed by machining the off-substrate was changed, and when the arrangement of the off-substrate was changed. The size and number of substrates were the same as in Example 6. Table 3 shows the substrate conditions and arrangement conditions.

TABLE 3

| Sample No. | Main substrate off-angle (degrees) | Off-substrate pre-machining off-angle (degrees) | Off-substrate post-machining off-angle (degrees) | Off-substrate position |
|---|---|---|---|---|
| 17 (Example 6) | 0.1-0.9 | 0.0 | 3.0 | center |
| 18 | 0.1-1.1 | 0.0 | 3.0 | center |
| 19 | 0.1-0.9 | 8.1 | 9.0 | center |
| 20 | 0.1-0.9 | 7.9 | 1.0 | center |
| 21 | 0.1-0.9 | 0.0 | 3.0 | outer periphery |

Figure 9:
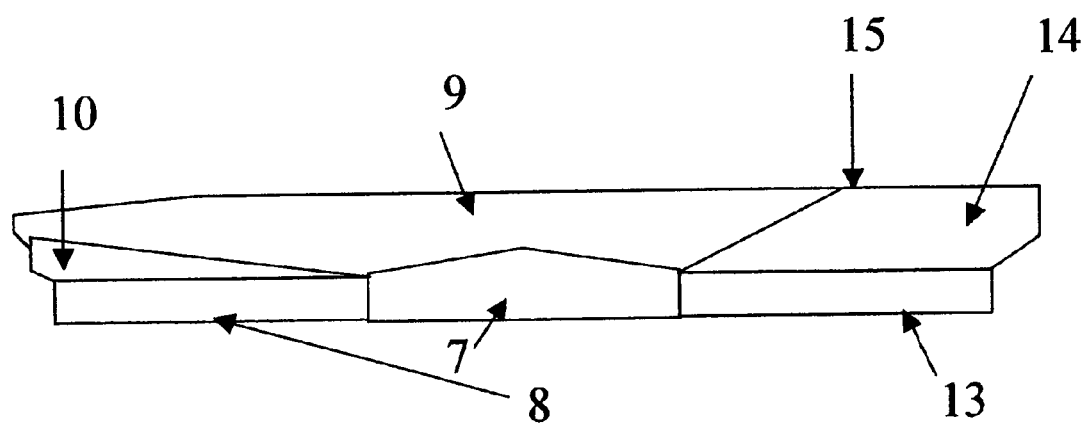
FIG. 9 is a schematic diagram of after the growth of the diamond single crystal in a comparative example (sample No. 18).

Sample No. 18 is a comparative example in which the off-angle of some of the main substrates deviates from the conditions of the present invention. When a diamond single crystal was grown under the growth conditions of Example 6, not only a single crystal 9 grown from the off-substrate 7, but also a single crystal 14 grown from the main substrate 13 with the largest off-angle also appeared on the surface, and small angle boundaries 15 remained (FIG. 9). After this, the vapor phase synthesized single crystal layer was cut out with a laser, and the hole mobility at normal temperature in the direction straddling the small angle boundaries was evaluated by Hall measurement, the result of which was that a value of 150 cm$^2$/V·sec was obtained, which was lower than that in the examples of this invention.

Sample No. 19 is a comparative example in which the pre-machining off-angle of the off-substrate deviates from the conditions of the present invention. When the same growth conditions as in Example 6 were applied, the off-angle became large, the single crystal growth conditions could not be maintained, and polycrystallization occurred.

Figure 10:
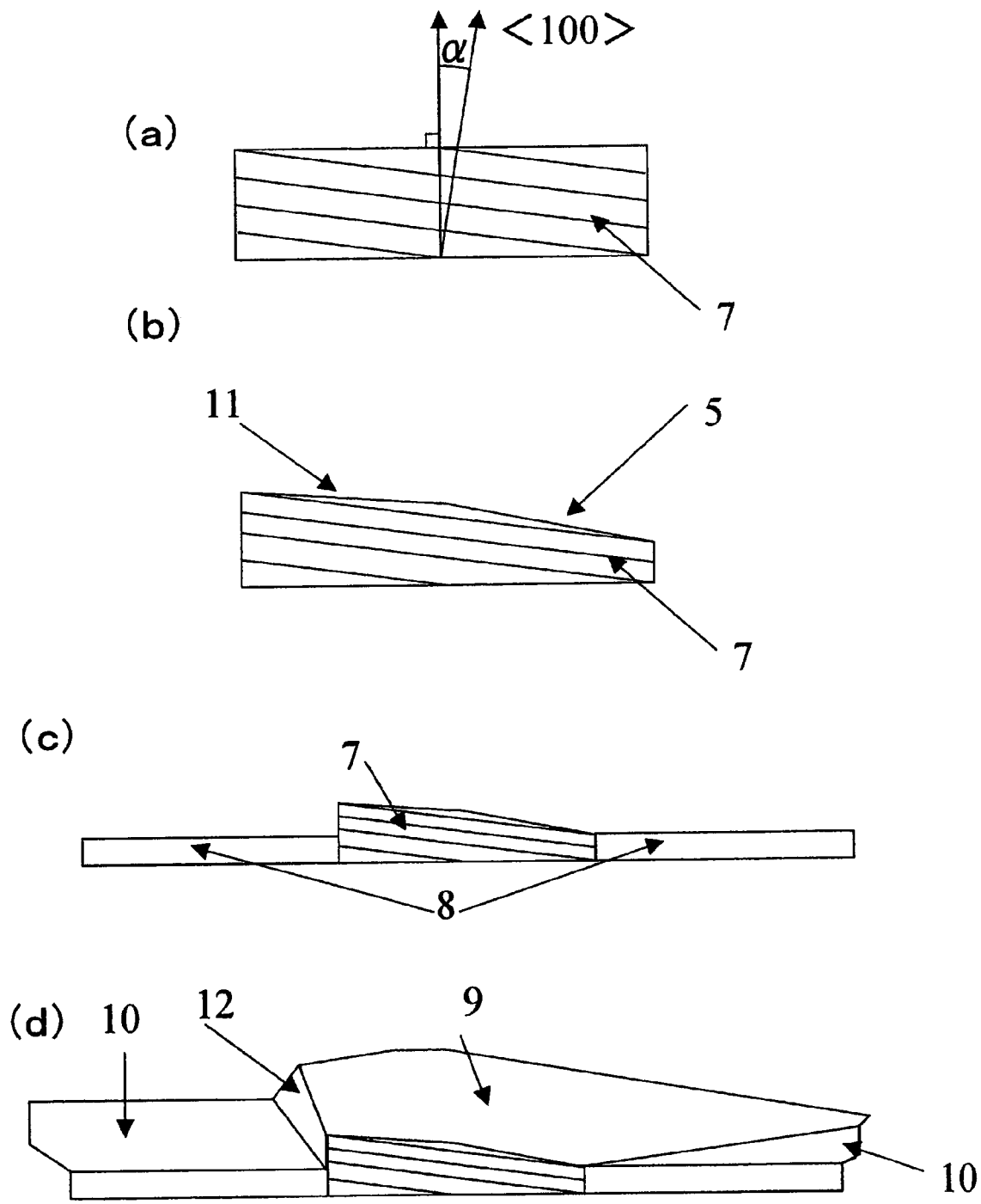
FIG. 10 is a schematic diagram of a comparative example, with FIG. 10(a) being a side view of the pre-machining off-substrate, FIG. 10(b) a side view of the off-substrate after forming the off-planes, FIG. 10(c) a side view of the off-substrate surrounded by the main substrates, and FIG. 10(d) a schematic diagram of after the growth of the diamond single crystal (sample No. 20).

Sample No. 20 is a comparative example in which the pre-machining off-angle of the off-substrate is within the range of the present invention (FIG. 10(a)), but the post-machining off-angle is smaller, and the off-plane 11 is inclined in the direction which is opposite from the outer peripheral direction in the range of this present invention (FIGS. 10(b) and (c)). In growth in which the same conditions as in Example 6 were applied, the outer peripheral part ended up being higher than the center part of the substrate, polycrystalline growth proceeded in the lateral growth region grown on the main substrates (FIG. 10(d)), and single crystal lateral growth could not be achieved.

Figure 11:
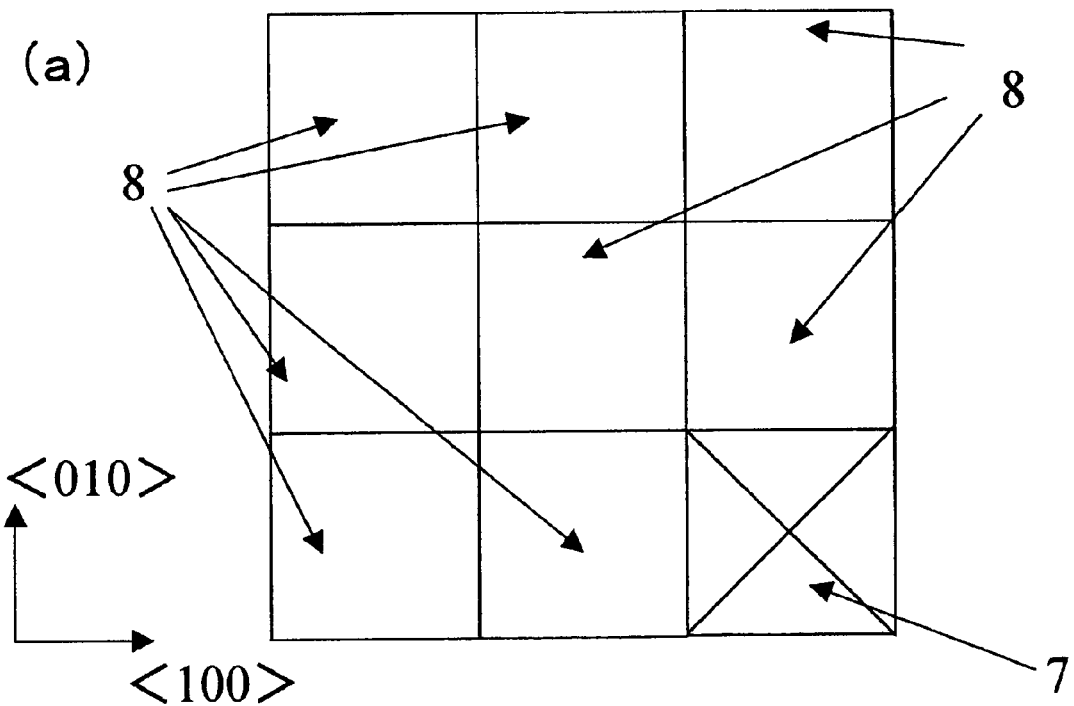
FIG. 11 is a schematic diagram of a comparative example (sample No. 21), with FIG. 11(a) being a top view of the substrate arrangement, and FIG. 11(b) a side view of after the growth of the diamond single crystal.
Figure 11:
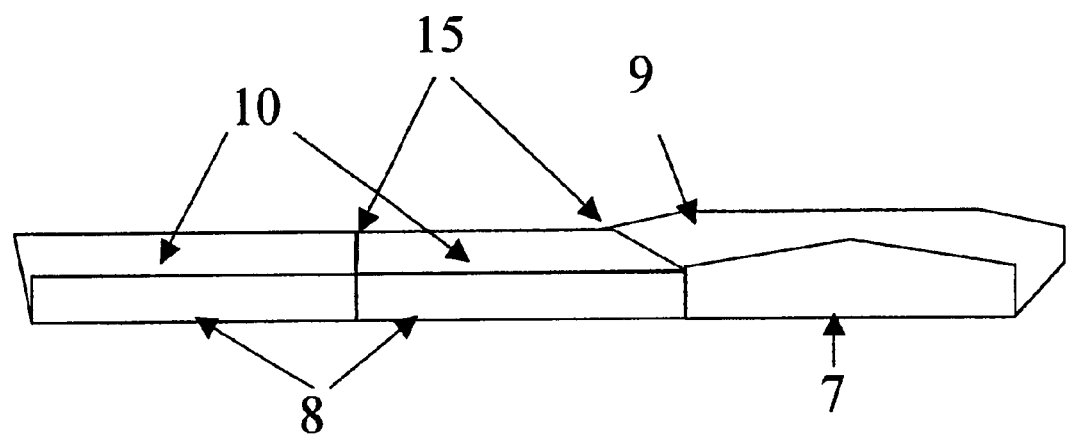

Sample No. 21 is a comparative example in which the off-substrate 7 was placed on the outer periphery as shown in FIG. 11(a), rather than in the center of the main substrates 8. When a diamond single crystal was grown under the conditions of Example 6, as shown in FIG. 11(b), the single crystal 9 grown from the off-substrate 7 covered part of the tops of the main substrates, but did not completely cover them, and small angle boundaries 15 remained on the surface. After this, the vapor phase synthesized single crystal layer was cut out with a laser, and the hole mobility at normal temperature in the direction straddling the small angle boundaries 15 was evaluated by Hall measurement, the result of which was that a value of 150 cm$^2$/V·sec was obtained, which was lower than that in the examples of this invention.

As discussed above, a diamond single crystal substrate manufactured by the methods represented in the examples was shown to be a large-area, high-quality single crystal substrate that can be used in semiconductor substrates and so forth.

What is claimed is:

1. A diamond single crystal substrate manufactured by a method comprising:
   preparing a diamond single crystal seed substrate which has a main surface whose planar orientation falls within an inclination range of not more than 8 degrees relative to a {100} plane or a {111} plane, as a seed substrate;
   forming on the main surface a plurality of planes of different orientations which are inclined in the outer peripheral direction of the main surface relative to the main surface on one side of the seed substrate, by machining, wherein the planar orientation of the plurality of planes is within an inclination range of at least 1 degree and not more than 8 degrees relative to the {100} plane or the {111} plane; and
   growing a diamond single crystal on the seed substrate by vapor phase synthesis, in which the growth width in the lateral direction from the seed substrate in a single crystal layer obtained by vapor phase synthesis is greater than the growth width in the upward direction from the seed substrate.

2. A diamond single crystal substrate which is constructed from a plurality of diamond single crystal seed substrates of uniform planar orientation lined up and integrated overall by growing diamond single crystals on the seed substrates by vapor phase synthesis, wherein a planar orientation of a main surface of all of the plurality of seed substrates but one has an inclination of less than 1 degree relative to a {100} plane, a planar orientation of a main surface of the remaining one seed substrate has an inclination of not more than 8 degrees relative to the {100} plane, the diamond single crystal substrate having been manufactured by a method comprising forming on the main surface of the remaining one seed substrate a plurality of planes of different orientation which are inclined in an outer peripheral direction of the main surface relative to the main surface on one side of the one seed substrate, by machining, wherein the planar orientation of the plurality of planes is within an inclination range of at least 1 degree and not more than 8 degrees relative to the {100} plane; lining up the plurality of seed substrates so as to surround the one seed substrate by the remaining plurality of seed substrates; and then growing diamond single crystals by vapor phase synthesis, whereby the diamond single crystal grown from this one seed substrate is made to cover the diamond single crystals grown on the other seed substrates and cause integrating.

* * * * *